United States Patent
Andrews et al.

(10) Patent No.: US 7,009,423 B1
(45) Date of Patent: **\*Mar. 7, 2006**

(54) PROGRAMMABLE I/O INTERFACES FOR FPGAS AND OTHER PLDS

(75) Inventors: William B. Andrews, Emmaus, PA (US); Fulong Zhang, Willow Grove, PA (US); Harold Scholz, Allentown, PA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/134,152

(22) Filed: May 20, 2005

Related U.S. Application Data (63) Continuation of application No. 10/613,462, filed on Jul. 3, 2003.

(51) Int. Cl.
*H03K 19/173* (2006.01)
*H03K 19/177* (2006.01)

(52) U.S. Cl. .................... 326/46; 326/40; 365/233; 365/189.02

(58) Field of Classification Search ............. 326/41, 326/46, 39, 40; 327/407, 415; 365/233, 365/189.02
See application file for complete search history.

(56) References Cited

U.S. PATENT DOCUMENTS

| | | | |
|---|---|---|---|
| 6,005,412 A | 12/1999 | Ranjan et al. | |
| 6,472,904 B1 | 10/2002 | Andrews et al. | |
| 6,686,769 B1 | 2/2004 | Nguyen et al. | |
| 6,791,889 B1 * | 9/2004 | Peterson | 365/193 |
| 2004/0155690 A1 | 8/2004 | Andrews et al. | |

OTHER PUBLICATIONS

U.S. Appl. No. 10/613,462, Andrews et al., pending.

* cited by examiner

*Primary Examiner*—Daniel Chang (57) ABSTRACT

A programmable logic device (PLD), such as a field programmable gate array (FPGA) has a logic core surrounded on one or more sides by an input/output (I/O) interface having one or more programmable I/O buffers (PIBs). At least one PIB can be programmed to perform two or more of (a) a pass-through data input mode, (b) an input register mode; (c) a double data rate (DDR) input mode, (d) one or more demux input modes, (e) one or more DDR demux input modes. In addition or alternatively, at least one PIB can be programmed to perform two or more of (a) a pass-through data output mode, (b) an output register mode, (c) a DDR output mode, (d) one or more mux output modes, and (e) one or more DDR mux output modes. As such, devices of the present invention are flexible enough to support both low-rate and high-rate interface applications, while efficiently using device resources.

20 Claims, 8 Drawing Sheets

PROGRAMMABLE I/O INTERFACES FOR FPGAS AND OTHER PLDS

RELATED APPLICATION DATA

This application is a continuation of application Ser. No. 10/613,462, filed Jul. 3, 2003, now U.S. Pat. No. 6,952,115.

TECHNICAL FIELD

The present invention relates to programmable logic devices (PLDs), such as field-programmable gate arrays (FPGAs), and, in particular, to the input/output (I/O) interfaces for such devices.

BACKGROUND

Figure 1:
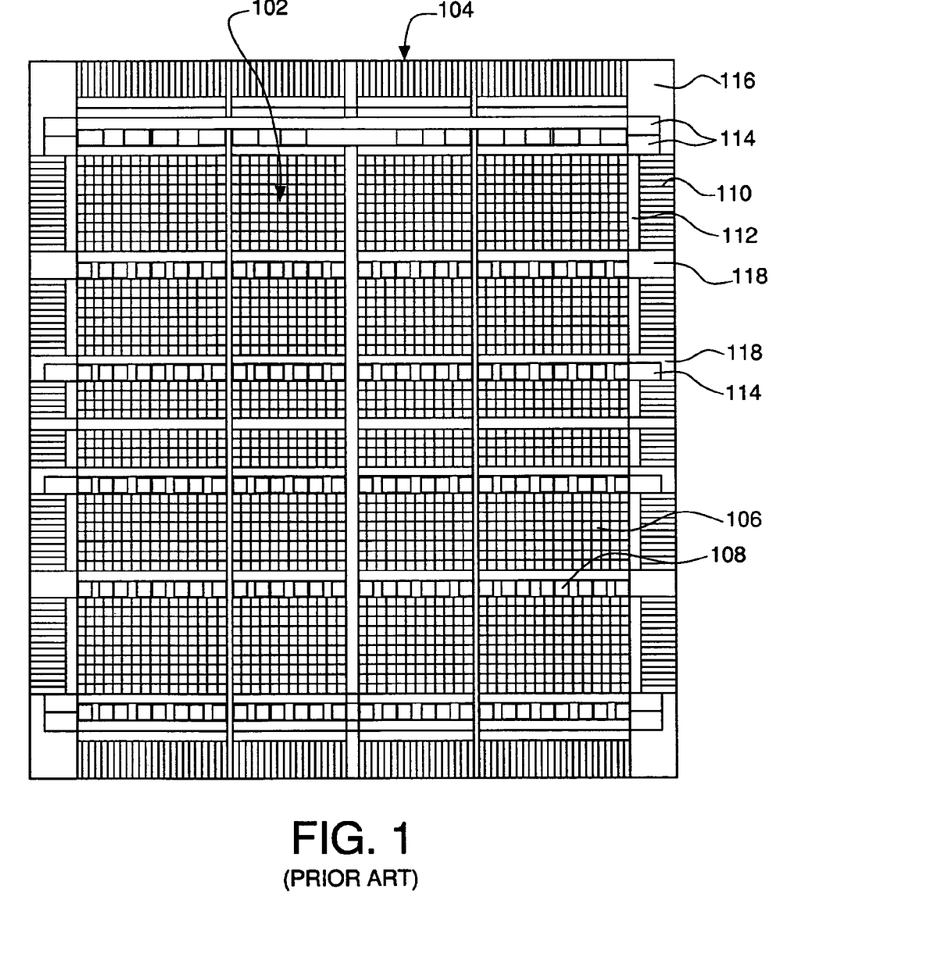
FIG. 1 shows a high-level block diagram of the layout of a conventional FPGA.

FIG. 1 shows a high-level block diagram of the layout of a conventional FPGA 100 having a logic core 102 surrounded (i.e., on one or more sides) by an input/output (I/O) ring 104. Logic core 102 includes an array of programmable logic blocks (PLBs) 106 intersected by rows of block memory 108. Each PLB contains circuitry that can be programmed to perform a variety of different functions. The memory blocks in each row are available to store data to be input to the PLBs and/or data generated by the PLBs. I/O ring 104 includes sets of programmable I/O buffers (PIBs) 110 programmably connected to the logic core by multiplexor/demultiplexor (mux/demux) circuits 112. The I/O buffers support external interfacing to FPGA 100. Also located within the I/O ring are a number of phase-locked loop (PLL) circuits 114 that are capable of providing different timing (i.e., clock) signals for use by the various elements within FPGA 100. Those skilled in the art will understand that FPGAs, such as FPGA 100, will typically include other elements, such as configuration memory, that are not shown in the high-level block diagram of FIG. 1. In addition, general routing resources, including clocks, buses, general-purpose routing, high-speed routing, etc. (also not shown in FIG. 1), are provided throughout the FPGA layout to programmably interconnect the various elements within FPGA 100.

The layout of a typical FPGA, such as FPGA 100 of FIG. 1, comprises multiple instances of a limited number of different types of blocks of circuitry. For example, an I/O ring may contain a number of instances of the same basic block of circuitry repeated around the periphery of the device. In the example of FPGA 100, I/O ring 104 is made up of multiple instances of the same basic programmable I/O circuit (PIC), where each PIC provides a particular number of the I/O buffers of the I/O ring. U.S. Pat. No. 6,472,904 B2 ("the '904 patent"), the teachings of which are incorporated herein by reference, provides a detailed description of an exemplary programmable I/O buffer of the prior art.

The rates of signals to be handled by FPGAs and other PLDs, and therefore the speeds at which I/O interfaces for such devices need to operate, exceed the current speed capabilities of the internal elements (e.g., the programmable logic blocks in the logic core) of these devices. In order to support such applications, I/O interfaces are designed to support demultiplexing of individual, incoming, high-rate signals into multiple, lower-rate signals that are then processed in parallel by the device's core logic. Similarly, I/O interfaces are designed to support multiplexing of multiple, low-rate signals into individual, higher-rate, outgoing signals. Nevertheless, individual prior-art I/O interfaces are still limited in the variety of muxing/demuxing schemes that they can support.

SUMMARY

The problems in the prior art are addressed in accordance with the principles of the present invention by a programmable I/O interface for FPGAs and other programmable logic devices, where the I/O interface supports a relatively wide range and variety of operational modes for demuxing incoming signals and muxing outgoing signals. As such, devices of the present invention are flexible enough to support both low-rate and high-rate interface applications, while efficiently using device resources.

In one embodiment, the present invention is a programmable logic device (PLD), comprising a logic core connected to an input/output (I/O) interface. The I/O interface comprises one or more programmable I/O buffers (PIBs), wherein at least one PIB can be programmed to perform two or more of the following operating modes: (a) a double data rate (DDR) input mode in which an incoming DDR data signal is converted into two single data rate (SDR) data signals that are made available to the logic core; (b) one or more demux input modes in which an incoming data signal is demultiplexed into two or more lower-rate data signals that are made available to the logic core; (c) one or more DDR demux input modes in which an incoming DDR data signal is converted into four or more lower-rate SDR data signals that are made available to the logic core; (d) one or more additional input modes in which an incoming data signal is made available to the logic core without any demultiplexing or DDR-to-SDR conversion. In addition or alternatively, at least one PIB can be programmed to perform two or more of the following operating modes: (a) a DDR output mode in which two SDR data signals from the logic core are converted into a single outgoing DDR data signal; (b) one or more mux output modes in which two or more data signals from the logic core are multiplexed into a single, higher-rate, outgoing data signal; (c) one or more DDR mux output modes in which four or more SDR data signals from the logic core are converted into a single, higher-rate, outgoing DDR data signal; and (d) one or more additional output modes in which a data signal from the logic core is provided as an outgoing data signal without any multiplexing or SDR-to-DDR conversion.

In another embodiment, the present invention is a PLD, comprising a logic core connected to an I/O interface. The I/O interface comprises one or more programmable I/O buffers (PIBs), wherein at least one PIB comprises a transfer stage adapted to apply a time-domain transfer to one or more data signals.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments.

According to preferred embodiments, the present invention may be implemented as an FPGA or other programmable logic device having an I/O ring with one or more programmable I/O circuits (PICs), where each PIC has one or more programmable I/O buffers (PIBs) that are capable of supporting a variety of different operational modes for demuxing incoming signals and muxing outgoing signals. For purposes of explanation, the following discussion relates to FPGA implementations, although the invention is not so limited. In the following discussion and in the claims, the term "logic core" refers to everything in the device that is not part of the device's I/O circuitry.

Processing Incoming Data Signals

The different input modes supported by a programmable I/O buffer of the present invention preferably include a data pass-through input mode, an input register mode, a double data rate (DDR) input mode, one or more data demux input modes, and one or more DDR demux input modes.

A data pass-through input mode is one in which an incoming data signal is provided to the FPGA's logic core without passing through a register in the I/O circuitry, although the incoming signal received from off-chip may be delayed or otherwise manipulated in some way before being provided to the logic core.

An input register mode is one in which an incoming data signal is clocked through one or more registers in the I/O circuitry, but is not demultiplexed or otherwise converted, before being provided to the logic core.

As understood by those skilled in the art, in a DDR data signal, each clock edge is associated with a different bit of data, while, in a single data rate (SDR) signal, each clock cycle is associated with a different bit of data. A DDR input mode converts an incoming DDR data signal into two SDR data signals: one SDR data signal representing the positive-going bits (i.e., those bits that are associated with the rising clock edges in the DDR data signal) and the other SDR data signal representing the negative-going bits (i.e., those bits that are associated with the falling clock edges in the DDR data signal).

A data demux input mode is one in which an incoming data signal is demultiplexed into two or more lower-rate data signals, each of which represents a fraction of the bits of the higher-rate incoming data signal.

A DDR demux input mode is one in which an incoming DDR data signal is converted into four or more lower-rate SDR data signals. In one implementation, this involves converting the incoming DDR data signal into two SDR data signals followed by demultiplexing each SDR data signal into two or more lower-rate SDR data signals.

Functional Block Diagram

Figure 2:
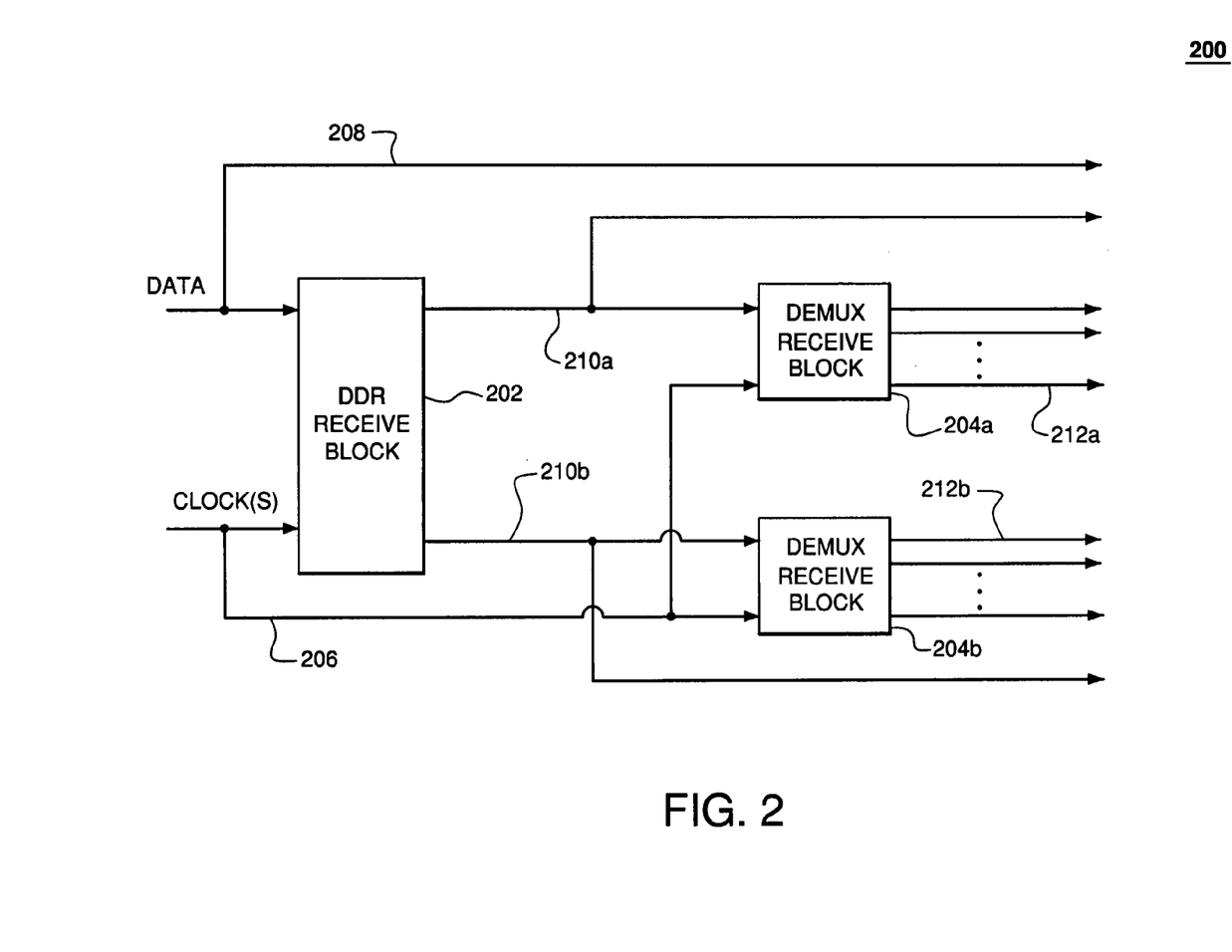
FIG. 2 shows a high-level functional block diagram representing the different input modes for processing incoming data signals supported by a programmable I/O buffer, according to one embodiment of the present invention.

FIG. 2 shows a high-level functional block diagram representing the different input modes for processing incoming data signals supported by a programmable I/O buffer 200, according to one embodiment of the present invention. In particular, FIG. 2 shows double data rate (DDR) receive block 202 connected to demux receive blocks 204a and 204b. Although the functional elements shown in FIG. 2 could correspond directly (e.g., in a one-to-one mapping) to discrete sets of hardware elements in an actual implementation of programmable I/O buffer 200, the primary purpose of FIG. 2 is to indicate the input data processing capabilities of the I/O buffer. As such, the I/O buffer could be implemented using hardware elements that do not necessarily correspond directly to the functional elements shown in FIG. 2. FIG. 2 is a high-level diagram that does not show all of the details of an actual implementation, such as those related to control signals.

DDR receive block 202 and demux receive blocks 204 are driven by one or more clock signals 206. Depending on the implementation, clock signals 206 may be generated internally (e.g., by a PLL (not shown) of the FPGA) or generated externally and received at an I/O pad (not shown) of the FPGA.

DDR receive block 202 is capable of converting an incoming DDR signal 208 (e.g., received from a corresponding I/O pad (not shown) of the FPGA) into two single data rate (SDR) signals 210a and 210b. In one implementation, signal 210a represents the positive-going bits associated with the rising clock edges in DDR signal 208, while signal 210b represents the negative-going bits associated with the falling clock edges in DDR signal 208.

In one implementation, the DDR-to-SDR conversion processing of DDR receive block 202 can be disabled. In this mode of operation, an incoming data signal 208 (which could be an SDR or a DDR data signal) would be presented intact (i.e., without applying any DDR-to-SDR conversion) as data signal 210a. In an alternative implementation, when the DDR-to-SDR conversion processing of DDR receive block 202 is disabled, an incoming data signal 208 could be presented intact as data signal 210b.

Each demux receive block 204 is capable of demultiplexing a corresponding data signal 210 into one or more demuxed signals 212, with the number of demuxed signals determined by the programming of the corresponding demux receive block 204. For example, in one possible implementation, each demux receive block is designed to support any of (1:1), (1:2), and (1:4) demultiplexing processing, depending on the set of control signals (not shown) used to control the operations of the demux receive block.

Alternative designs might be able to support additional and/or alternative modes, including higher order demultiplexing modes.

In one implementation, demux receive blocks 204a and 204b are both controlled by a common set of control signals. As such, the two demux receive blocks are always configured to perform identical, demultiplexing processing in parallel. In alternative implementations, the demux receive blocks could be controlled using different sets of control signals, in which case, they could be configured to perform different types of demultiplexing processing (i.e., two different levels of demuxing) at the same time.

Depending on how DDR receive block 202 and demux receive blocks 204a–b are programmed via their associated control signals, any of data signals 208, 210a–b, and 212a–b can be made available to the FPGA's logic core via the FPGA's programmable routing resources.

The circuitry represented in FIG. 2 supports the different input modes described previously, where any particular input mode is selected by appropriately programming the operations of the functional elements shown in FIG. 2. These different input modes are described in the following paragraphs.

For a data pass-through input mode, incoming data signal 208 can be provided to the FPGA's logic core intact by bypassing DDR receive block 202 and demux receive blocks 204a–b.

For an input register mode, incoming data signal 208 can pass through DDR receive block 202 with its DDR-to-SDR conversion processing disabled to provide the incoming data signal intact as data signal 210a, which then bypasses demux receive block 204a. Yet another way to achieve an input register mode would be to pass that same data signal 210a through demux receive block 204a, with demux receive block 204a programmed in a (1:1) demux mode. In each of these cases, the incoming data signal, and therefore the data signal provided to the logic core, could be either an SDR or a DDR data signal.

For a DDR input mode, incoming DDR data signal 208 is converted by DDR receive block 202 into two SDR data signals 210a and 210b, which can then bypass demux receive blocks 204a and 204b. Alternatively, those two SDR data signals 210a and 210b can be passed through demux receive blocks 204a and 204b, respectively, with both demux receive blocks programmed in (1:1) demux modes.

For a data demux input mode, incoming data signal 208 passes through DDR receive block 202 with its DDR-to-SDR conversion processing disabled to provide the incoming data signal intact as data signal 210a, which is then demultiplexed by demux receive block 204a to provide two or more different, lower-rate data signals to the logic core, where the number of demuxed data signals depends on the design and programming of the demux receive block. Here, too, the incoming data signal, and therefore each lower-rate data signal provided to the logic core, could be either an SDR data signal or a DDR data signal. Since the DDR-to-SDR conversion processing of DDR receive block 202 is disabled, if data signal 208 is a DDR data signal, then each data signal 212a would also be a DDR data signal, albeit at a lower rate.

For purposes of this specification, whenever incoming or outgoing DDR data signals pass through the I/O circuitry of the present invention intact (i.e., without being converted to or from two SDR data signals), it will be assumed that the internal clock signals used to process those signals are run at twice the normal "SDR" clock rate. Depending on the implementation, such DDR clock signals may be generated on-chip, e.g., using the device's PLLs or DLLs, or received from off-chip. This processing for incoming DDR data signals is described in further detail later in this specification in conjunction with FIG. 8.

For a DDR demux input mode, incoming DDR data signal 208 is converted by DDR receive block 202 into two SDR data signals 210a and 210b, which are then demultiplexed by demux receive blocks 204a and 204b, respectively, to provide four or more different, lower-rate SDR data signals to the logic core, where the number of lower-rate SDR data signals depends on the design and programming of the demux receive blocks.

Exemplary Hardware Implementation

Figure 3:
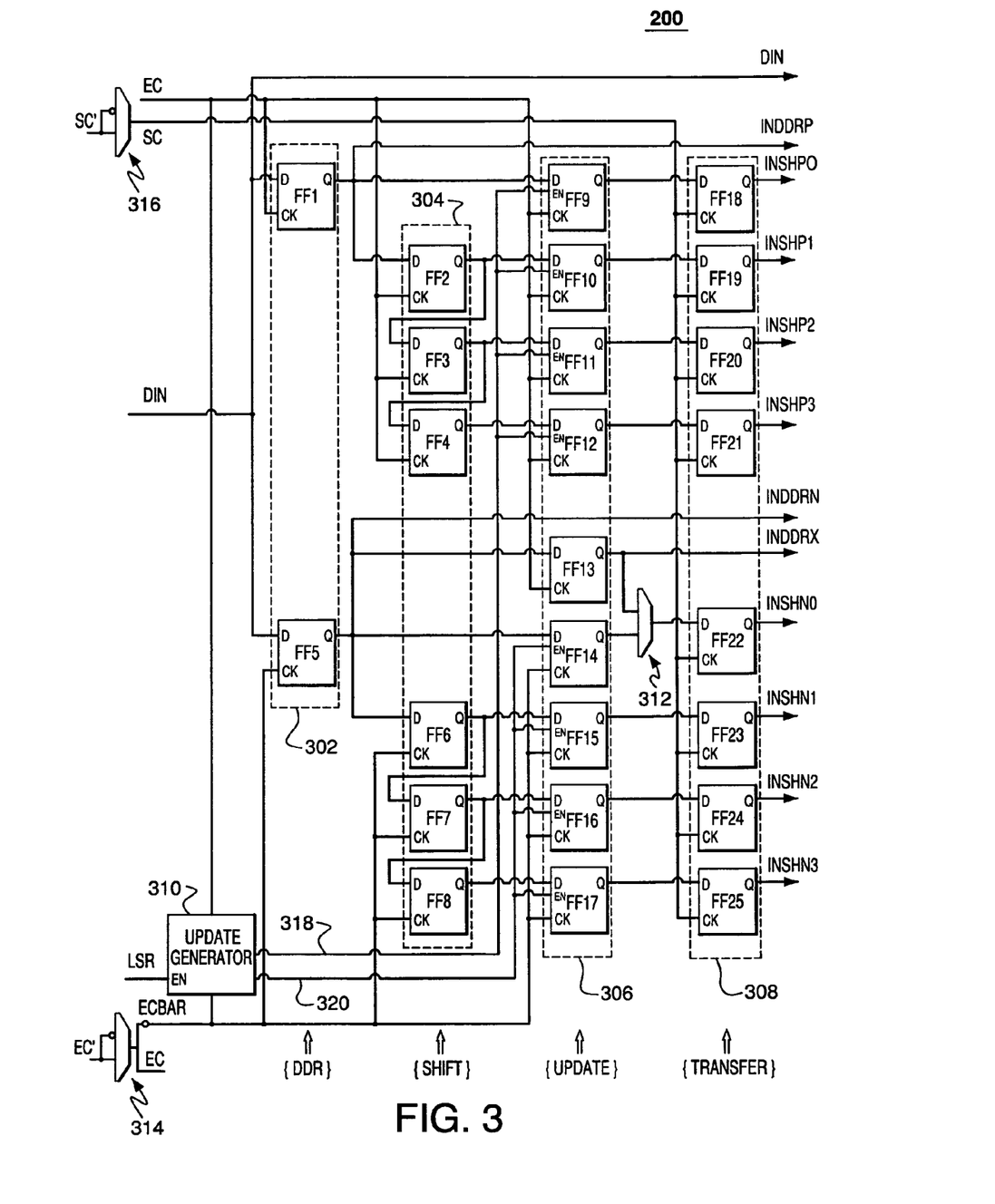
FIG. 3 shows a block diagram of the elements of the programmable I/O buffer of FIG. 2 that support input processing of an incoming data signal, according to one implementation of the present invention.

FIG. 3 shows a block diagram of the elements of programmable I/O buffer 200 that support input processing of an incoming data signal, according to one implementation of the present invention. FIG. 3 shows 25 flip-flops (labeled FF1 through FF25) arranged in four stages: FF1 and FF5 in DDR stage 302, FF2–FF4 and FF6–FF8 in shift stage 304, FF9–FF17 in update stage 306, and FF18–FF25 in transfer stage 308. In addition to the 25 flip-flops, FIG. 3 shows update generator 310 and muxes 312, 314, and 316.

As shown in FIG. 3, the incoming data signal DIN is applied to the data inputs (D) of both FF1 and FF5. The data output (O) of FF1 is applied to signal line INDDRP and the data inputs of FF2 and FF9. Similarly, the data output of FF5 is applied to signal line INDDRN and the data inputs of FF6, FF13, and FF14. As described below, FF1 and FF5 of DDR stage 302 can operate as a DDR-to-SDR converter.

The incoming data signal DIN can also be provided directly to the logic core, bypassing all of flip-flops shown in FIG. 3.

The data output of FF2 is applied to the data inputs of FF3 and FF10. The data output of FF3 is applied to the data inputs of FF4 and FF11. The data output of FF4 is applied to the data input of FF12. The data output of FF6 is applied to the data inputs of FF7 and FF15. The data output of FF7 is applied to the data inputs of FF8 and FF16. The data output of FF8 is applied to the data input of FF17. Because the data outputs of FF1–FF3 are tied to the data inputs of FF2–FF4, respectively, these four flip-flops can be operated as a two-, three-, or four-bit shift register. Similarly, flip-flops FF5–FF8 can be operated as a two-, three-, or four-bit shift register. The shift register formed from FF1–FF4 can operate in combination with FF9–FF12 of update stage 306 as a demultiplexer capable of operating in any of (1:1), (1:2), (1:3), and (1:4) demux modes. Similarly, the shift register formed from FF5–FF8 can operate in combination with FF14–FF17 of update stage 306 as a second demultiplexer capable of operating in any of the same demux modes.

The data outputs of FF9–FF12 are applied to the data inputs of FF18–FF21, respectively. The data output of FF13 is applied to signal line INDDRX and to a first input of mux 312. The data output of FF14 is applied to a second input of mux 312. The output of mux 312 is applied to the data input of FF22. The data outputs of FF15–FF17 are applied to the data inputs of FF23–FF25, respectively. The data outputs of FF18–FF25 are applied to signal lines INSHP0-3 and INSHN0-3, respectively.

Each flip-flop in FIG. 3 is driven by one of an edge clock signal (EC), the logical inverse of clock signal EC (ECBAR), and a (typically) lower-speed, system clock signal (SC), which is preferably the same clock that drives the FPGA's logic core. In particular, clock EC drives flip-flops FF1, FF2–FF4, and FF9–FF13; clock ECBAR drives flip-flops FF5, FF6–FF8, and FF14–FF17; and clock SC drives flip-flops FF18–FF25.

In the implementation of FIG. 3, mux 314 enables clock signals EC and ECBAR to be inverted together, such that the edge clock signal EC' received by the I/O circuitry or its inverse can be selectively used for clock EC of FIG. 3. Analogously, mux 316 enables clock SC to be inverted, such that the system clock signal SC' received by the I/O circuitry or its inverse can be selected used for clock SC of FIG. 3.

In the implementation shown in FIG. 3, FF1–FF4 and FF9–FF13 are driven off the positive edge of clock EC, while FF5–FF8 and FF14–FF17 are driven off the positive edge of clock ECBAR (an inverted version of clock EC). In an alternative implementation, FF5–FF8 and FF14–FF17 could be negative-edge-triggered flip-flops that are driven off the negative edge of clock EC. These same alternative implementations will apply throughout this specification to any component that is shown being driven either off the positive edge of an inverted clock signal or off the negative edge of the corresponding non-inverted clock signal.

Clocking data through the flip-flops of transfer stage 308 based on system clock SC performs a time-domain transfer from the time domain of the I/O buffer (i.e., based on clocks EC and ECBAR) and the time domain of the logic core (i.e., based on clock SC). Performing this time-domain transfer within the I/O buffer circuitry provides advantages over designs in which the time-domain transfer is performed in the logic core.

In prior art designs, time-domain transfer was performed within the logic core. When automatic place-and-route tools were used to determine exactly where in the logic core to implement that transfer processing, that placement could vary from device to device as a function of the particular application. As a result, the time delays corresponding to signal transfer between the I/O circuitry and the components (e.g., flip-flops) that performed of the time-domain transfer could not be predicted with sufficient accuracy in order to meet the timing requirements of some applications. For such applications, the automatic place-and-route tools would have to be overridden in order to manually place the flip-flops at known locations within the logic core in order to be able to predict the timing delays with sufficient accuracy.

By implementing the time-domain transfer within the I/O circuitry, as in preferred embodiments of the present invention, the timing delays are sufficiently known and the timing requirements of all applications can be met without having to override the operations of automatic place-and-route tools. This can reduce the overall design effort, thereby reducing the costs and overall timing of such work.

It should be noted that, in general, the different input (and output) modes supported by certain embodiments of the present invention can be provided without implementing time-domain transfer within the I/O circuitry. By the same token, implementing time-domain transfer within the I/O circuitry can be implemented without supporting the full range of input (and output) modes of those certain embodiments.

Update generator 310 receives clocks EC and ECBAR as well as a local set-reset signal LSR, and generates update signals 318 and 320, where update signal 320 is an inverted version of update signal 318. Update signal 318 generated by update generator 310 is applied to the enable inputs (EN) of FF9–FF12 to selectively enable or disable those flip-flops, while update signal 320 is applied to the enable inputs of FF14–FF17.

As described in the following paragraphs, depending on how the various elements in FIG. 3 are programmed, the circuitry of FIG. 3 is capable of operating in any of the different input modes described earlier.

For a data pass-through input mode, incoming data signal DIN is provided to the logic core without passing through any registers. Note that the incoming data signal DIN shown in FIG. 3 may have been delayed or otherwise manipulated before reaching the circuitry shown in FIG. 3.

For an input register mode, incoming data signal DIN is clocked through FF1 and provided intact on signal line INDDRP. Another way to achieve an input register mode would be to clock incoming data signal DIN through FF5 and out on signal line INDDRN. Yet another way to achieve an input register mode would be to clock the output from FF1 through FF9 and then through FF18. Analogously, data input register modes could be achieved using other combinations of flip-flops with appropriate clocking. In each of these cases, incoming data signal DIN, and therefore the data signal provided to the logic core (e.g., INDDRP), could be either an SDR or a DDR data signal.

For a DDR input mode, the speed of clock EC is equal to the rate of the incoming DDR data signal DIN. With, for example, FF1 triggered by the rising edge of clock EC, the output data from FF1 will be an SDR data signal corresponding to the positive-going bits in DDR data signal DIN. Similarly, with FF5 triggered by the rising edge of clock ECBAR (i.e., an inverted version of EC), the output data from FF5 will be an SDR data signal corresponding to the negative-going bits in DDR data signal DIN. These two SDR signals can be provided on signal lines INDDRP and INDDRN, respectively. Alternatively, the output data from FF5 can be clocked through FF13 onto signal line INDDRX. Since both FF9 and FF13 are clocked by clock EC, this mode of operation applies a half-cycle clock transfer between FF5 and FF13 to synchronize the two SDR data signals on INDDRP and INDDRX. Alternatively, the two SDR data signals from FF1 and FF5 could be clocked through different combinations of flip-flops, such as through FF9 and FF18 and through FF14, mux 312, and FF22, respectively, onto signal lines INSHP0 and INSHN0.

The circuitry of FIG. 3 can support any of (1:1), (1:2), (1:3), and (1:4) data demux input modes. For example, for a (1:2) data demux input mode, with FF9–FF10 disabled by update signal 318, during a first clock cycle, a first bit of incoming data signal DIN is clocked through FF1 and into FF2. During a second clock cycle, with FF9–FF10 enabled by update signal 318, the first bit of DIN is clocked from FF2 into FF10, while the second bit of DIN is clocked from FF1 into FF9. During a third clock cycle, with FF9–FF10 again disabled by update signal 318, the third bit of DIN is clocked from FF1 into FF2. During a fourth clock cycle, with FF9–FF10 again enabled by update signal 318, the third bit of DIN is clocked from FF2 into FF10, while the fourth bit of DIN is clocked from FF1 into FF9. With the data outputs from FF9–FF10 clocked through FF18–FF19 based on clock SC, signal lines INSHP0 and INSHP1 will be provided with two lower-rate data signals corresponding to the results of demultiplexing DIN in a (1:2) demux mode. This technique can be extended to achieve the other data demux input modes using one or more of FF1–4. Alternatively, analogous data demux input modes can be achieved using the FF5–FF8 in combination with FF14–FF17, mux 312, and FF22–FF25. Note that, in certain implementations, update generator 310 is capable of generating both positive and negative update signals to handle the half-cycle offsets between the upper and lower shift registers in FIG. 3 that result from differently driving those shift registers using clocks EC and ECBAR.

Here, too, the incoming data signal DIN, and therefore each demultiplexed data signal provided to the logic core, could be either an SDR data signal or a DDR data signal. If a data signal DIN is a DDR data signal, then each demultiplexed data signal would also be a DDR data signal, albeit at a lower rate.

By combining the DDR-to-SDR conversion capabilities of FF1 and FF5 with the demuxing capabilities supported by the shift registers, the circuitry of FIG. 3 can be used to provide DDR demux input modes in which an incoming DDR data signal DIN is converted into a number of (i.e., up to eight) lower-rate SDR data signals, where the number depends on the particular programmed level of demultiplexing.

Processing Outgoing Data Signals

The different output modes supported by a programmable I/O buffer of the present invention preferably include a data pass-through output mode, an output register mode, a double data rate (DDR) output mode, one or more data mux output modes, and one or more DDR mux output modes.

A data pass-through output mode is one in which an outgoing data signal is provided to the external world (i.e., presented at a pad associated with the I/O buffer) without passing through a register in the I/O circuitry.

An output register mode is one in which an outgoing data signal is clocked through one or more registers in the I/O circuitry, but is not multiplexed or otherwise converted, before being provided to the external world.

For outgoing data, a DDR output mode converts two SDR data signals into a single, outgoing DDR data signal.

A data mux output mode is one in which two or more data signals are multiplexed together to form a single, higher-rate, outgoing data signal.

A DDR mux output mode is one in which four or more SDR data signals are converted into a single, outgoing DDR data signal. In one implementation, this involves muxing half of the SDR data signals to form one higher-rate SDR data signal and muxing the other half of the SDR data signals to form another higher-rate SDR data signal followed by converting the two SDR data signals into the single, outgoing DDR data signal.

Functional Block Diagram

Figure 4:
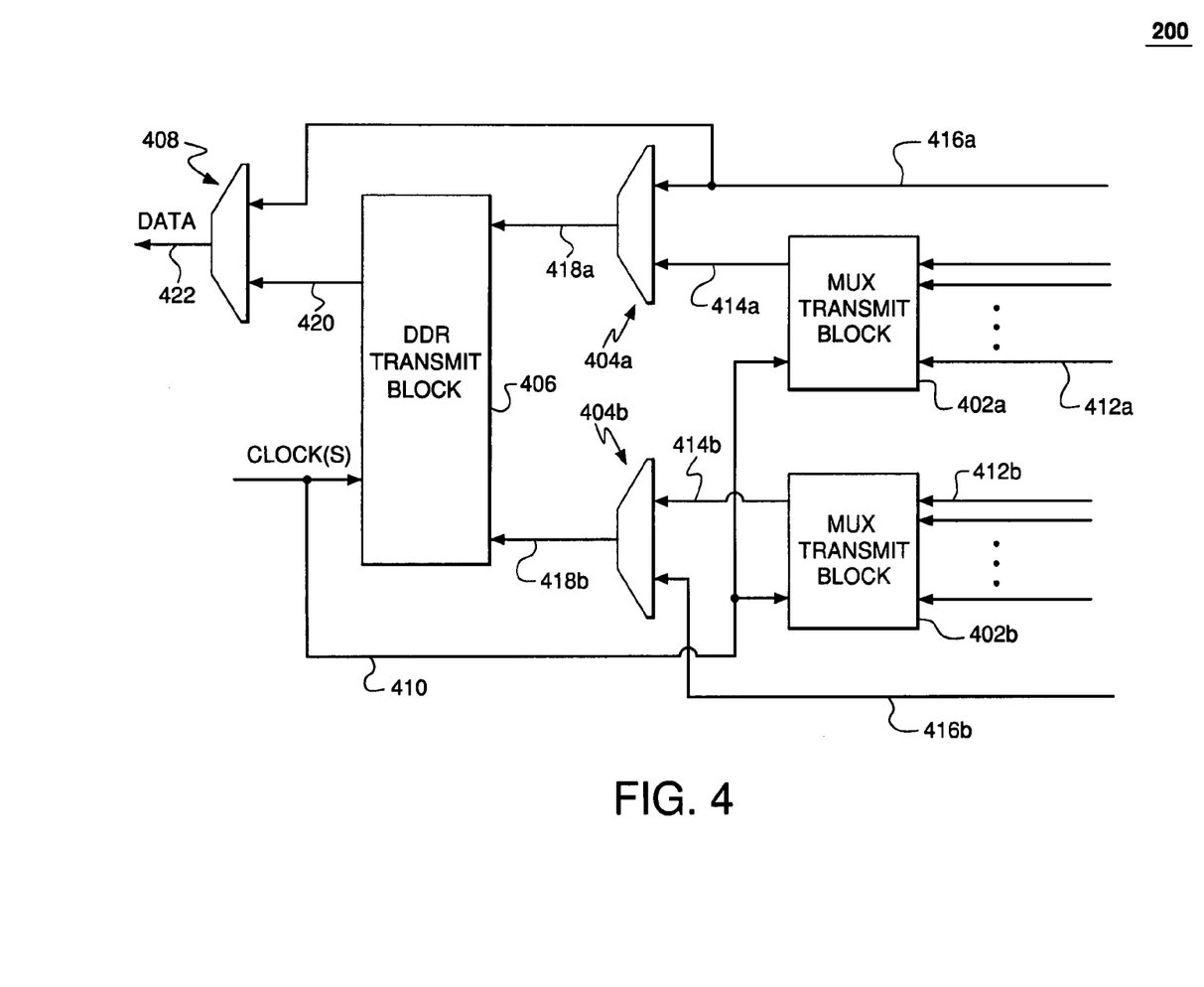
FIG. 4 shows a high-level functional block diagram representing the different output modes for processing outgoing data signals supported by the programmable I/O buffer of FIG. 2, according to one embodiment of the present invention.

FIG. 4 shows a high-level functional block diagram representing the different output modes for processing outgoing data signals supported by programmable I/O buffer 200, according to one embodiment of the present invention. In particular, FIG. 4 shows mux transmit blocks 402a and 402b, each of which is connected to a corresponding one of muxes 404a and 404b, which are in turn connected to DDR transmit block 406, which is in turn connected to mux 408. Although the functional elements shown in FIG. 4 could correspond directly (e.g., in a one-to-one mapping) to discrete sets of hardware elements in an actual implementation of programmable I/O buffer 200, the primary purpose of FIG. 4 is to indicate the output data processing capabilities of the programmable I/O buffer. As such, the I/O buffer could be implemented using hardware elements that do not correspond directly to the functional elements shown in FIG. 4. As with FIG. 2, FIG. 4 is a high-level diagram that does not show all of the details of an actual implementation, such as those related to control signals.

Mux transmit blocks 402a and 402b and DDR transmit block 406 are driven by one or more clock signals 410. Depending on the implementation, clock signal(s) 410 may be the same as clock signal(s) 206 of FIG. 2 and/or may be generated internally (e.g., by a PLL (not shown) of the FPGA) or generated externally and received at an I/O pad (not shown) of the FPGA.

Each mux transmit block 402 is capable of muxing a selected number of different data signals 412 to form a single, higher-rate data signal 414. For example, in one possible implementation, each mux transmit block is designed to support any of (1:1), (2:1), and (4:1) mux processing, depending on the set of control signals (not shown) used to control the operations of the mux transmit block. Data signals 212 are typically received from the FPGA's logic core. Alternative designs might be able to support additional and/or alternative mux modes.

In one implementation, mux transmit blocks 402a and 402b are both controlled by a common set of control signals. As such, the two mux transmit blocks are always configured to perform identical mux processing in parallel. In alternative implementations, the mux transmit blocks could be controlled using different sets of control signals, in which case, they could be configured to perform different types of multiplexing processing (i.e., two different levels of muxing) at the same time.

As shown in FIG. 4, mux 404a receives data signal 414a and unregistered data signal 416a and, depending on its set of mux control signals (not shown), selects one of those data signals for output as data signal 418a. Similarly, mux 404b receives data signal 414b and unregistered data signal 416b and, depending on its set of mux control signals (not shown), selects one of those data signals for output as data signal 418b.

DDR transmit block 406 is capable of converting two SDR data signals 418a and 418b into a single DDR data signal 420. In one implementation, the SDR-to-DDR conversion processing of DDR transmit block 406 can be disabled. In this mode of operation, a data signal 418a (which could be an SDR or a DDR data signal) would be presented intact as data signal 420. In alternative implementations, when the SDR-to-DDR conversion processing of DDR transmit block 406 is disabled, data signal 418b could be presented intact as data signal 420.

Mux 408 receives data signal 420 and data signal 416a and, depending on its set of mux control signals (not shown), selects one of those data signals for output as outgoing data signal 422, which is then provided to a corresponding I/O pad (not shown) of the FPGA.

Depending on how the various functional elements of FIG. 4 are programmed via their associated control signals, any of data signals 416a–b and 412a–b can be used to generate outgoing data signal 422.

The circuitry represented in FIG. 4 supports the different output modes described previously, where any particular output mode is selected by appropriately programming the operations of the functional elements shown in FIG. 4. These different output modes are described in the following paragraphs.

For a data pass-through output mode, data signal 416a can be provided intact as outgoing data signal 422 via mux 408 by bypassing the rest of the functional elements of FIG. 4.

For an output register mode, data signal 416a can pass through mux 404a intact as signal 418a, which is then passed through DDR transmit block 406 with its SDR-to-DDR conversion processing disabled to provide the data signal intact as data signal 420a, which is then provided as outgoing data signal 422 via mux 408. Yet another way to achieve an output register mode would be to pass a single data signal 412a through mux transmit block 402a, with mux transmit block 402a programmed in a (1:1) mux mode, to provide signal 414a, which is then selected by mux 404a to form signal 418a, which then passes through DDR transmit block 406 and mux 408 as before. In each of these cases, the data signal received from the logic core, and therefore outgoing data signal 422, could be either an SDR or a DDR data signal.

For a DDR output mode, SDR data signals 416a and 416b are selected by muxes 404a and 404b, respectively, to form SDR data signals 418a and 418b, which are converted to a single, DDR data signal 420 by DDR transmit block 406, which signal 420 is then selected by mux 408 to form outgoing DDR data signal 422. Alternatively, a single SDR data signal 412a and a single SDR data signal 412b could be passed through mux transmit blocks 402a and 402b (programmed in their (1:1) mux modes) to form SDR data signals 414a and 414b, respectively, which are then selected by muxes 404a and 404b, respectively, to form the two SDR data signals 418a and 418b, which are then converted as before.

For a data mux output mode, two or more data signals 412a are multiplexed by mux transmit block 402a to form a single, higher-rate data signal 414a, where the number of data signals to be muxed together depends on the design and programming of the mux transmit block. For example, a particular mux transmit block might be able to support any of (1:1), (2:1), and (4:1) mux modes. Alternative designs might be able to support additional and/or alternative modes. Data signal 414a is then selected by mux 404a to form data signal 418a, which passes through DDR transmit block with its SDR-to-DDR conversion processing disabled to provide data signal 210a, which is then selected by mux 408 to form outgoing data signal 422. Here, too, each data signal 412a, and therefore outgoing data signal 422, could be either an SDR data signal or a DDR data signal. Since the SDR-to-DDR conversion processing of DDR transmit block 406 is disabled, if data signals 412a are DDR data signals, then outgoing data signal 422 would also be a DDR data signal, albeit at a higher rate.

For a DDR mux output mode, two or more data signals 412a are multiplexed by mux transmit block 402a to form a single, higher-rate data signal 414a, where the number of data signals to be muxed together depends on the design and programming of the mux transmit block. Similarly, two or more data signals 412b are multiplexed by mux transmit block 402b to form a single, higher-rate data signal 414b. Data signals 414a and 414b are then selected by muxes 404a and 404b to form data signals 418a and 418b, respectively, which are then converted to a single, DDR data signal 420, which is selected by mux 408 to form outgoing data signal 422.

Exemplary Hardware Implementation

Figure 5:
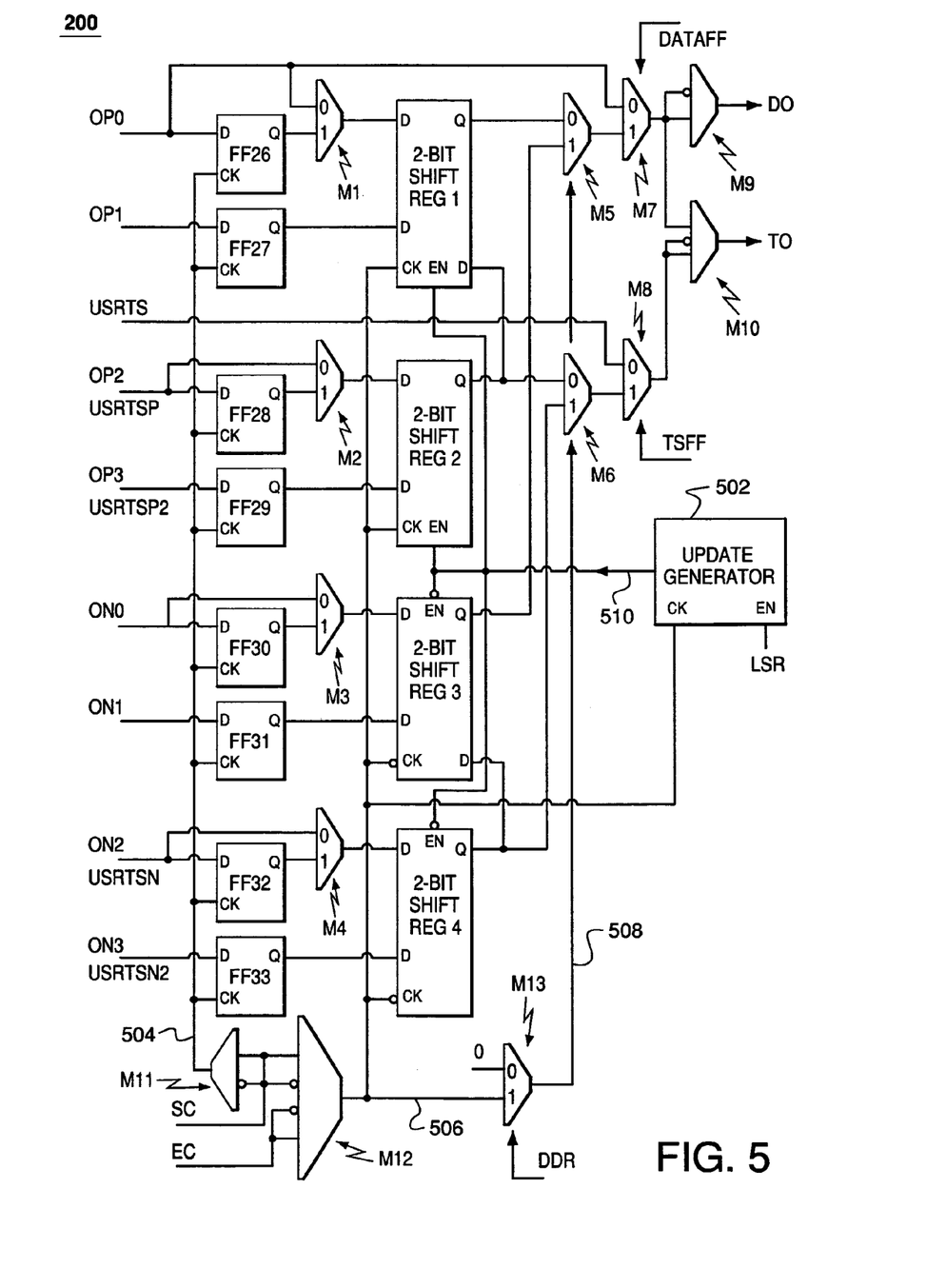
FIG. 5 shows a block diagram of the elements of the programmable I/O buffer of FIG. 2 that support output processing of outgoing data signals, according to one implementation of the present invention.

FIG. 5 shows a block diagram of the elements of programmable I/O buffer 200 that support output processing of outgoing data signals, according to one implementation of the present invention. FIG. 5 shows eight flip-flops FF26 through FF33, four 2-bit shift registers REG1 through REG4, thirteen muxes M1 through M13, and update generator 502, which may be the same as update register 310 of FIG. 3.

As shown in FIG. 5, signal line OP0 is applied to the data input of FF26, a first input of M1, and a first input of M7. Signal line OP1 is applied to the data input of FF27. Signal line USRTS is applied to a first input of M8. Signal line OP2/USRTSP is applied to the data input of FF28 and a first input of M2. Signal line OP3/USRTSP2 is applied to the data input of FF29. Signal line ON0 is applied to the data input of FF30 and a first input of M3. Signal line ON1 is applied to the data input of FF31. Signal line ON2/USRTSN is applied to the data input of FF32 and a first input of M4. Signal line ON3/USRTSN2 is applied to the data input of FF33.

The data output of FF26 is applied to a second input of M1, and the output of M1 is applied to a first data input of REG1. The data output of FF27 is applied to a second data input of REG1. The data output of FF28 is applied to a second input of M2, and the output of M2 is applied to a first data input of REG2. The data output of FF29 is applied to a second data input of REG2. The data output of FF30 is applied to a second input of M3, and the output of M3 is applied to a first data input of REG3. The data output of FF31 is applied to a second data input of REG3. The data output of FF32 is applied to a second input of M4, and the output of M4 is applied to a first data input of REG4. The data output of FF33 is applied to a second data input of REG4.

The data output of REG1 is applied to a first input of M5. The data output of REG2 is applied to a third data input to REG1 and a first input of M6. The data output of REG3 is applied to a second input of M5. The data output of REG4 is applied to a third data input to REG4 and a second input of M6.

The output of M5 is applied to a second input of M7. The output of M6 is applied to a second input of M8. The output of M7 is applied to inverted and non-inverted inputs of data output mux M9 and to a non-inverted input to tristate output mux M10. The output of M8 is applied to inverted and non-inverted inputs to M1. Data output mux M9 can be used to invert the output data signal from mux M7 to generate outgoing data signal DO. Tristate output mux M10 provides an outgoing tristate signal TO corresponding to outgoing data signal DO from mux M9. In addition to receiving the output of mux M8, tristate mux M10 receives the output from mux M7. This enables tristate mux M10 to be configured in an open-drain mode, as described in U.S. Pat. No. 6,028,447, the teachings of which are incorporated herein by reference.

The various elements in FIG. 5 are driven by edge clock signal (EC), its logical inverse, system clock signal (SC), or its logical inverse. In particular, mux M11 selects either system clock SC or its logical inverse as clock signal 504, which drives flip-flops FF26–FF33 as a time-domain transfer stage. Mux M12 selects either system clock SC, its logical inverse, edge clock EC, or its logical inverse as clock signal 506, which drives shift registers REG1–REG4 and update generator 502. Mux M13 selects either clock signal 506 or a zero signal as control signal 508, which controls the selections of muxes M5 and M6.

Clocking data through flip-flops FF26–FF33 based on system clock SC (or its logical inverse), while clocking data through shift registers REG1–REG4 based on edge clock EC (or its logical inverse) applies a time-domain transfer from the time domain of the logic core (i.e., based on clock SC) and the time domain of the I/O buffer (i.e., based on clock EC). As in the demux circuitry of FIG. 3, performing this time-domain transfer within the I/O buffer circuitry provides advantages over designs in which the time-domain transfer is performed in the logic core.

Update generator 502 receives clock signal 506 and local set-reset signal LSR and generates update signal 510, which is applied directly to the enable inputs (EN) of shift registers REG1–REG2 and inverted before being applied to the enable inputs of shift registers REG3–REG4. Update signal 510 can be used to control whether shift registers REG1–REG2 operate in a (1:1), (2:1), or (4:1) mux mode. Similarly, update signal 510 controls whether shift registers REG3–REG4 operate in a (1:1), (2:1), or (4:1) mux mode.

As described in the following paragraphs, depending on how the various elements in FIG. 5 are programmed, the circuitry of FIG. 5 is capable of operating in any of the different output modes described earlier.

For a data pass-through output mode, a data signal on signal line OP0 can be applied directly to the first input of mux M7, which will pass that data signal to mux M9 when the mode control signal DataFF is zero. During this data pass-through output mode, a user-specified tristate signal on signal line USRTS is applied to the first input of mux M8, which will pass that tristate signal to mux M10 when the mode control signal TSFF is zero. When mode control signal DataFF is one, mux M7 selects the output from mux M5. Similarly, when mode control signal TSFF is one, mux M8 selects the output from mux M6.

For an output register mode, data signal OP0 can be clocked through FF26, mux M1, shift register REG1, mux M5, and mux M7. In this case, mode control signal DDR would cause mux M13 to select the zero input as control signal 508, causing mux M5 to select the data output from REG1, and mode control signal DataFF could cause mux M7 to select the output from mux M5. During this mode of operation, a tristate signal on signal line OP2/USRTSP would be clocked through FF28, mux M2, shift register REG2, mux M6, and mux M8, with corresponding mode control signals set appropriately. Data signal OP0, and therefore outgoing data signal DO, could be either an SDR or a DDR data signal.

For a DDR output mode, mux M12 selects the edge clock EC (or its logical inversion) as clock signal 506, and mux M13 selects clock signal 506 as control signal 508, where the speed of clock EC is equal to the rate of the desired outgoing DDR data signal DO. In this mode, an SDR data signal OP0 is clocked through FF26, mux M1, and shift register REG1 and applied to the first input of mux M5. At the same time, an SDR data signal ON0 is clocked through FF30, mux M3, and shift register REG3 and applied to the second input of mux M5. Note that shift register REG3 is driven by the logical inversion of clock signal 506, which imposes a half-cycle offset between the data signals arriving at mux M5 from REG1 and REG3. Another implementation would have the control to mux M5 inverted, which would impose a full-cycle path between the data signals arriving at mux M5 from REG1 and REG3. In that case, the data from either REG1 or REG3 should be designed to arrive at mux M5 before the control signal in order to achieve glitch-less operation.

The selection by mux M5 is driven by control signal 508, which is based on clock signal EC. As a result, the output from mux M5 corresponds to a DDR data signal formed from the two SDR data signals OP0 and ON0. By analogous processing, two user-specified SDR tristate signals USRTSP and USRTSN are applied to FF28 and FF32, respectively, and ultimately applied to the two inputs of mux M6, which, by virtue of being controlled by control signal 508, converts those two SDR tristate signals into a single, DDR tristate signal applied to mux M8.

Depending on the control signals generated by the update generator 502, the circuitry of FIG. 5 can support any of (1:1), (2:1), (3:1), and (4:1) data mux output modes. In these data mux output modes, mux M13 selects the zero input at control signal 508, causing muxes M5 and M6 to select their first inputs. The particular level of data muxing is controlled by update signal 510 from update generator 502 appropriately enabling and disabling shift registers REG1–REG4.

For example, for a (2:1) data mux output mode, data signals OP0 and OP1 are clocked (through FF26–FF27 and mux M1) into shift register REG1 in parallel and read out from shift register REG2 serially, which resulting (2:1) multiplexed data signal is then selected by muxes M5 and M7. At the same time, tristate signals USRTSP and USRTSP2 are clocked (through FF28–FF29 and mux M2) into shift register REG2 in parallel and read out from shift register REG2 serially, which resulting multiplexed tristate signal is then selected by muxes M6 and M8.

For a (4:1) data mux mode, data signals OP0 and OP1 are clocked into shift register REG1 and data signals OP2 and OP3 are clocked into shift register REG2. The data in shift registers REG1 and REG2 are serialized by clocking the data from REG2 into the third data input of REG1 and reading all of the data out from REG1, where the resulting (4:1) multiplexed data signal is then selected by muxes M5 and M7. In this mode, the tristate signal is applied via signal line USRTS to mux M10 by setting control signal TSFF of mux M8 to zero.

Here, too, each data signal from the logic core, and therefore the resulting multiplexed outgoing data signal DO, could be either an SDR data signal or a DDR data signal. If the lower-rate data signals are DDR data signals, then the outgoing data signal DO would also be a DDR data signal, albeit at a higher rate.

By combining the SDR-to-DDR conversion capabilities of muxes M5 and M6 with the muxing capabilities supported by the shift registers REG1–REG4, the circuitry of FIG. 5 can be used to provide DDR mux output modes in which a number of (e.g., up to eight) SDR data signals are converted into a single, outgoing DDR data signal DO, where the number depends on the particular programmed level of multiplexing. Here, too, depending on the level of multiplexing, the tristate signal may be applied via signal line USRTS to mux M10 by setting control signal TSFF of mux M8 to zero.

Two-Bit Shift Register

Figure 6:
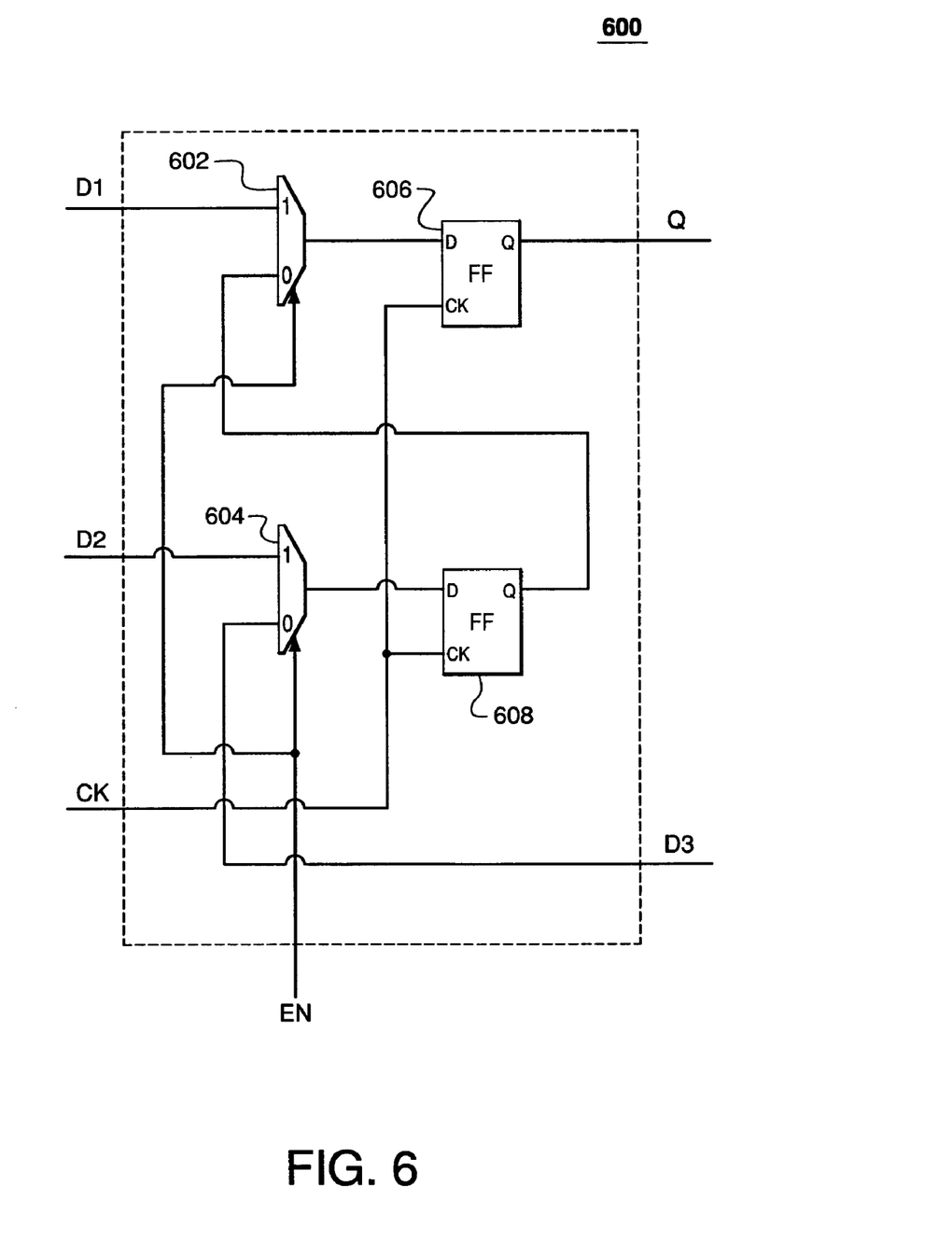
FIG. 6 shows a schematic diagram of a two-bit shift register that can be used for shift register REG1 of FIG. 5, according to one possible implementation of the present invention.

FIG. 6 shows a schematic diagram of a two-bit shift register 600 that can be used for shift register REG1 of FIG. 5, according to one possible implementation of the present invention. As shown in FIG. 6, shift register 600 comprises two muxes 602 and 604 and two flip-flops 606 and 608. Mux 602 receives data input D1 and the Q output of FF 608 and presents its output to the D input of FF 606. Mux 604 receives data inputs D2 and D3 and presents its output to the D input of FF 608. The Q output of FF 606 is presented as the Q output of shift register 600.

Muxes 602 and 604 are controlled by enable signal EN (corresponding to update signal 510 of FIG. 5), and FFs 606 and 608 are clocked by clock signal CK (corresponding to clock signal 506 of FIG. 5). When enable signal EN is high, mux 602 passes data input D1 to FF 606, and mux 604 passes data input D2 to FF 608. When enable signal EN is low, mux 602 passes the Q output from FF 608 to the D input of FF 606, and mux 604 passes data input D3 to the D input of FF 608.

By appropriately controlling enable signal EN, two-bit shift register 600 can support a number of different multiplexing modes. In particular, by keeping enable signal EN high, shift register 600 will clock data input D1 to the register's Q output to provide a (1:1) multiplexing mode. Note that, in this mode, data inputs D2 and D3 never make it to the register's Q output. Alternatively, by having enable signal EN track clock signal CK, shift register 600 will provide a (2:1) multiplexing mode. In particular, when enable signal EN is high, FF 606 will receive data input D1 and FF 608 will receive data input D2. When clock signal CK goes high, FF 606 will present data input D1 at the register's Q output and FF 608 will present data input D2 at mux 602. When enable signal EN is low, FF 606 will receive data input D2 and FF 608 will receive data input D3. When clock signal CK goes high again, FF 606 will present data input D2 at the register's Q output and FF 608 will present data input D3 at mux 602. This processing is repeated to multiplex input data D1 and D2 onto the register's Q output. Note that, in this mode, data input D3 never makes it to the register's Q output.

To support a (4×1) multiplexing mode (in combination with another two-bit shift register), enable signal EN is high every fourth time clock signal CK goes high and enable signal EN is low for the other three rising edges of clock signal CK. In this way, shift register 600 presents (1) input data D1 at the register's Q output for the first rising edge when enable signal EN is high, (2) input data D2 for the second rising edge when enable signal EN is low, and (3) input data D3 for the third and fourth rising edges when enable signal EN is still low. As a result, for every one bit of input data D1 and every one bit of input data D2, shift register 600 generates a (4:1) multiplexed data signal that also includes two bits of input data D3.

Shift register REG2 of FIG. 5 can be implemented using a shift register based on the design of shift register 600 where data input D3 and mux 604 may be tied off or even omitted, in which case data input D2 is presented directly to the D input of FF 608.

Shift register REG3 of FIG. 5 can be implemented using a shift register based on the design of shift register 600 by inverting the clock signal CK.

Shift register REG4 of FIG. 5 can be implemented using a shift register based on the design of shift register 600 where data input D3 and mux 604 may be tied off or even omitted, in which case data input D2 is presented directly to the D input of FF 608, and by inverting the clock signal CK.

Update Generator

Figure 7:
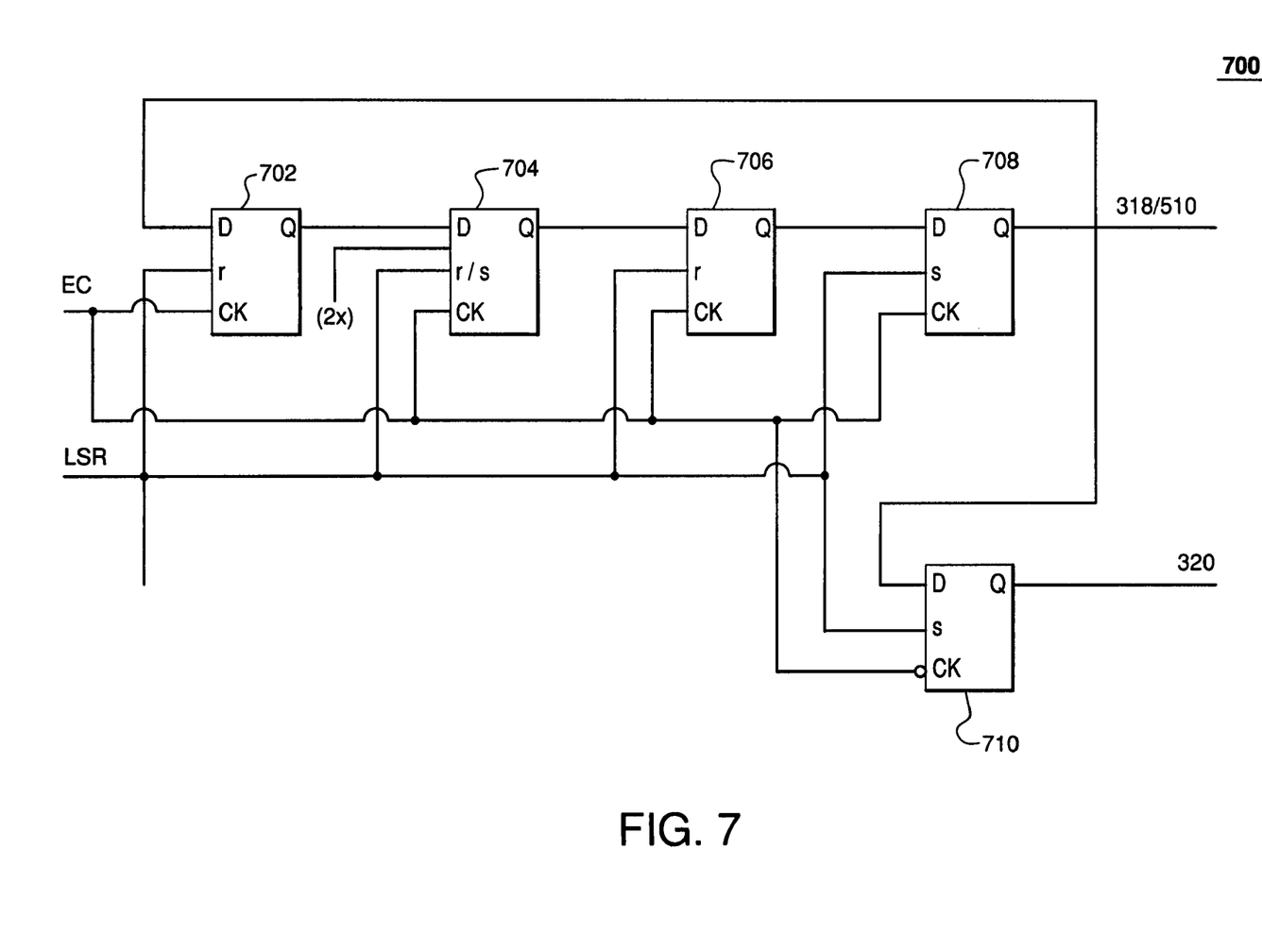
FIG. 7 shows schematic diagram of an update generator that can be used for the update generator of FIG. 3 as well as for the update generator of FIG. 5, according to one possible implementation of the present invention.

FIG. 7 shows schematic diagram of an update generator 700 that can be used for update generator 310 of FIG. 3 as well as for update generator 502 of FIG. 5, according to one possible implementation of the present invention. As shown in FIG. 7, update generator 700 comprises five flip-flops 702–710. FFs 702–708 are configured in a ring, where the Q output of each FF is presented to the D input of the next FF in the ring. The Q output of FF 708 is also presented to the D input of FF 710. FFs 702–708 are clocked by clock signal EC, while clock signal EC is inverted at the clock input of FF 710 (to form the equivalent of clock signal ECBAR). Alternatively, as indicated in FIG. 3, FF 710 could be clocked by clock signal ECBAR, which is just an inverted version of clock signal EC. It all depends on whether the update generator is implemented with FF 710 as a negative-edge triggered flip-flop driven by clock signal EC or a positive-edge triggered flip-flop driven by inverted clock signal ECBAR. Local set-reset signal LSR controls the setting/resetting of FFs 702–710. In particular, when LSR goes high, the Q outputs of FFs 702 and 706 are reset to zero, while the Q outputs of FFs 708 and 710 are set to one. The setting/resetting of FF 704 depends on whether or not update generator 700 is generating update signals for a 2× operating mode (e.g., either a 1:2 demultiplexing mode or a 2:1 multiplexing mode). For a 2× operating mode, when LSR goes high, the Q output of FF 704 is set to one. For a 4× operating mode (e.g., either a 1:4 demultiplexing mode or a 4:1 multiplexing mode), when LSR goes high, the Q output of FF 704 is reset to zero.

By appropriately setting the LSR signal, update generator 700 will generate appropriate update signals corresponding to update signals 318 and 320 of FIG. 3 and update signal 510 of FIG. 5, for controlling the operations of FF9–FF12 and FF14–FF17 of FIG. 3 and of two-bit shift registers REG1–REG4 of FIG. 5, respectively.

Processing Incoming DDR Data Signals Without DDR-to-SDR Conversion

As described previously, an incoming DDR data signal can be passed to the logic core either intact or as two or more demultiplexed DDR data signals without converting the DDR data signal into two SDR data signals. This is achieved by processing the incoming DDR data signal using one or more clock signals that run at twice the normal "SDR" clock rate.

Figure 8:
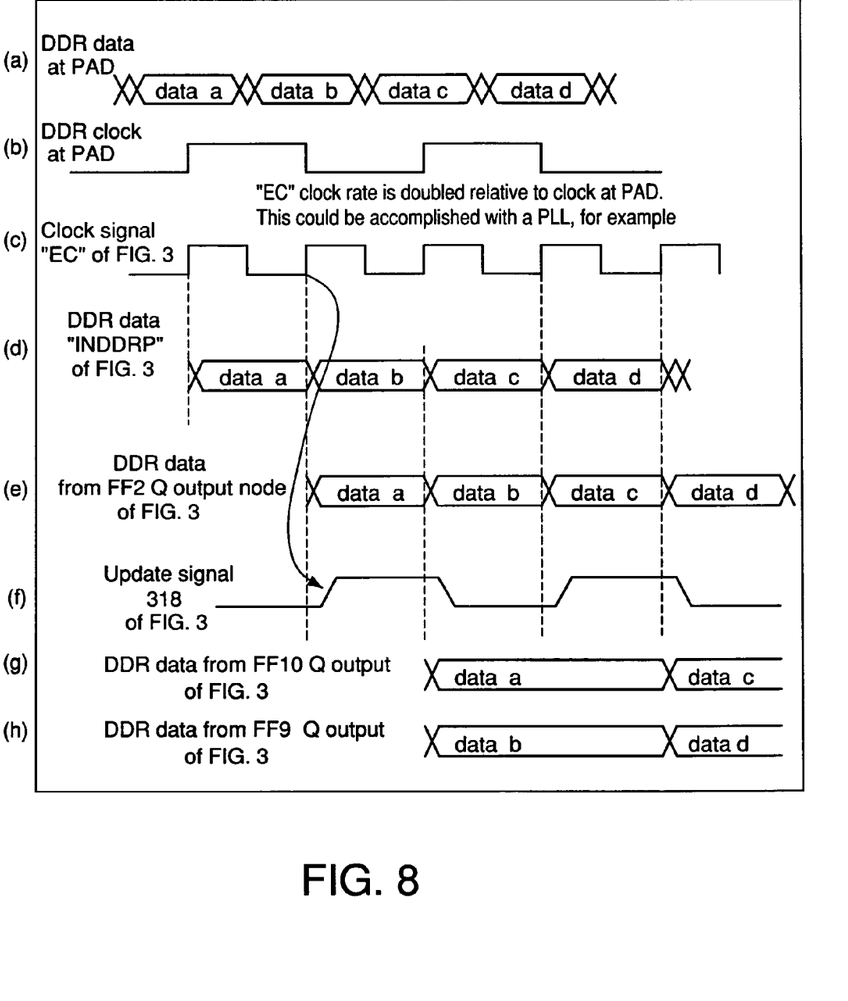
FIG. 8 shows a timing diagram illustrating two different exemplary processing modes for an incoming DDR data signal.

FIG. 8 shows a timing diagram illustrating two different exemplary processing modes for an incoming DDR data signal. In particular, with reference to the circuitry of FIG. 3, FIG. 8 illustrates an input register mode, in which the incoming DDR data signal DIN is clocked through FF1 and provided intact on signal line INDDRP. In addition, FIG. 8 illustrates a (1:2) data demux input mode, in which the incoming DDR data signal DIN is clocked through FF1, FF2, FF9, FF10, FF18, and FF19 to provide two demultiplexed (i.e., lower-rate) DDR data signals on signal lines INSHP0 and INSHP1.

Timelines (a) and (b) in FIG. 8 represent, respectively, the incoming DDR data signal and its corresponding (externally generated) DDR clock signal as received at two device pads. As indicated in these timelines, a data bit (e.g., bit a, b, c, or d) in the incoming DDR data signal is associated with each different rising and falling edge in the DDR clock signal. The incoming DDR data signal received at the pad gets presented to the circuitry of FIG. 3 on signal line DIN.

Timeline (c) represents clock signal EC of FIG. 3, which may be generated, for example, by doubling the DDR clock signal of timeline (b) using an on-chip PLL. This "double-rate" clock signal EC is used to clock data signal DIN through FF1. Timeline (d) represents the "delayed" DDR data signal generated at the Q output of FF1 and provided on signal line INDDRP. This corresponds to processing the incoming DDR data signal using the input register mode.

In addition to being provided on signal line INDDRP, the Q output of FF1 is also provided to the D input of FF2, which is also clocked by clock signal EC. Timeline (e) represents the "further delayed" DDR data signal generated at the Q output of FF2. As shown in FIG. 3, the Q outputs of FF1 and FF2 are provided to the D inputs of FF9 and FF10, respectively. FF9 and FF10 are clocked by clock signal EC and enabled by update signal 318 from update generator 310. Timeline (f) represents an appropriate update signal 318 for a (1×2) demuxing operation. In particular, at each rising edge of update signal 318 in timeline (f), FF9 samples the Q output of FF1 and FF10 samples the Q output of FF2. Timeline (g) represents the Q output from FF10 and timeline (h) represents the Q output from FF9, when FF9 and FF10 are enabled using the update signal of timeline (f). As represented in FIG. 8, each of the data signals of timelines (g) and (h) is half the rate of the incoming DDR data signal of timeline (a), where the data signal of timeline (g) contains bits a and c, and the data signal of timeline (h) contains bits b and d. After a time-domain transfer implemented by clocking the two half-rate data signals through FF18 and FF19, respectively, the resulting data signals correspond to two demultiplexed DDR data signals provided on signal lines INSHP0 and INSHP1, thereby completing the (1×2) data demux input mode.

Those skilled in the art will understand how to extend the exemplary processing represented in FIG. 8 to the other input modes of operation supported by the circuitry of FIG. 3.

Alternative Implementations

Depending on the particular implementation, the architectures shown in FIGS. 3 and 5 may share certain components. For example, in a preferred implementation, update generator 310 of FIG. 3 and update generator 502 of FIG. 5 are implemented as a single, shared update generator. Similarly, control signal LSR and the clock signals SC and EC are shared.

The present invention has been described in the context of a particular architecture that can support multiplexing modes up to (4:1) and demultiplexing modes up to (1:4), with or without corresponding SDR/DDR conversion. As suggested previously, the present invention is not so limited. Higher levels of multiplexing and demultiplexing can be achieved by adding additional flip-flops to appropriate stages in the designs and providing appropriate control signals to exploit the functionality of such additional components.

The present invention has been described in the context of circuitry that is driven by a single system clock and a single edge clock. Those skilled in the art will understand that the present invention can be expanded to employ more than two clocks with appropriate muxing to select specific clocks to be used to drive particular components.

Although the present invention has been described in the context of FPGAs, those skilled in the art will understand that the present invention can be implemented in the context of other types of PLDs, such as, without limitation, mask-programmable gate arrays (MPGAs), SRAM-based PLDs, DRAM-based PLDs, flash memory-based PLDs, and ASICs with user control signals.

It will be further understood that various changes in the details, materials, and arrangements of the parts which have been described and illustrated in order to explain the nature of this invention may be made by those skilled in the art without departing from the scope of the invention as expressed in the following claims.

We claim:

1. A programmable logic device (PLD), comprising: a logic core connected to an I/O interface, the I/O interface comprising one or more programmable I/O buffers (PIBs), wherein at least one PIB comprises:
    double data rate (DDR) circuitry programmable to convert an incoming DDR data signal into two single data rate (SDR) data signals; and
    demultiplexing circuitry coupled to the DDR circuitry and programmable to demultiplex at least one of the two SDR data signals into two or more lower-rate SDR data signals provided to the logic core of the PLD.

2. The programmable logic device of claim 1, wherein the DDR circuitry and demultiplexing circuitry are clocked by a same clock signal.

3. The programmable logic device of claim 1, including a bypass line coupled to an input of the DDR circuitry and operable to provide an incoming DDR data signal to the logic core.

4. The programmable logic device of claim 1, including a bypass line coupled to an output of the DDR circuitry and operable to provide an SDR data signal to the logic core.

5. The programmable logic device of claim 1, wherein the demultiplexing circuitry includes a shift register.

6. The programmable logic device of claim 1, wherein the demultiplexing circuitry is operable to support a plurality of demux input modes.

7. The programmable logic device of claim 1 including an update generator responsive to a clock signal and operable to enable or disable flip-flops within the demultiplexing circuitry.

8. The programmable logic device of claim 1 including:
    multiplexing circuitry programmable to multiplex two or more outgoing single data rate (SDR) data signals into at least one higher-rate SDR data signal; and
    double data rate (DDR) circuitry coupled to the multiplexing circuitry and programmable to convert higher-rate SDR data signals into an outgoing DDR data signal.

9. A programmable logic device (PLD), comprising: a logic core connected to an I/O interface, the I/O interface comprising one or more programmable I/O buffers (PIBs), wherein at least one PIB comprises:
    multiplexing circuitry programmable to multiplex two or more outgoing single data rate (SDR) data signals from the logic core of the PLD into at least one higher-rate SDR data signal; and
    double data rate (DDR) circuitry coupled to the multiplexing circuitry and programmable to convert the at least one higher-rate SDR data signal into an outgoing DDR data signal.

10. The programmable logic device of claim 9, wherein the DDR circuitry and multiplexing circuitry are clocked by a same clock signal.

11. The programmable logic device of claim 9 including a multiplexer operable to select between a higher-rate SDR data signal from the multiplexing circuitry and an unregistered data signal as a data signal to the DDR circuitry.

12. The programmable logic device of claim 9 including a multiplexer operable to select between an outgoing DDR data signal from the DDR circuitry and an unregistered data signal as an outgoing data signal of the I/O buffer.

13. The programmable logic device of claim 9, wherein the multiplexing circuitry is operable to support a plurality of mux output modes.

14. The programmable logic device of claim 9, wherein the multiplexing circuitry includes a shift register operable to support a plurality of mux output modes.

15. The programmable logic device of claim 9, wherein the programmable logic device is a field programmable gate array (FPGA).

16. A programmable logic device (PLD), comprising: a logic core connected to an I/O interface, the I/O interface comprising one or more programmable I/O buffers (PIBs), wherein at least one PIB comprises:
    multiplexing circuitry programmable to multiplex four or more lower-rate single data rate (SDR) data signals into two higher-rate SDR data signals;
    demultiplexing circuitry programmable to demultiplex two higher-rate SDR data signals into four or more lower-rate SDR data signals; and
    double data rate (DDR) circuitry coupled to the demultiplexing circuitry and programmable to convert an incoming DDR data signal into two higher-rate single data rate (SDR) data signals for the demultiplexing circuitry and further coupled to the multiplexing circuitry and programmable to convert two higher-rate SDR data signals from the multiplexing circuitry into an outgoing DDR data signal.

17. The programmable logic device of claim 16 including a bypass line coupled to an input of the DDR circuitry and operable to provide an incoming DDR data signal to the logic core.

18. The programmable logic device of claim 16 including a bypass line coupled to an output of the DDR circuitry and operable to provide a higher-rate SDR data signal to the logic core.

19. The programmable logic device of claim 16 including a multiplexer operable to select between a higher-rate SDR data signal from the multiplexing circuitry and an unregistered data signal as a data signal to the DDR circuitry.

20. The programmable logic device of claim 16 including a multiplexer operable to select between an outgoing DDR data signal from the DDR circuitry and an unregistered data signal as an outgoing data signal of the I/O buffer.

* * * * *